United States Patent
Park et al.

(10) Patent No.: US 9,368,724 B2
(45) Date of Patent: Jun. 14, 2016

(54) METHOD OF MANUFACTURING ORGANIC LIGHT-EMITTING DISPLAY APPARATUS INCLUDING A DONOR FILM AND TRANSFER LAYER

(71) Applicant: Samsung Display Co., Ltd., Yongin, Gyeonggi-Do (KR)

(72) Inventors: Jin-Woo Park, Yongin (KR); Myung-Jong Jung, Yongin (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 14/095,201

(22) Filed: Dec. 3, 2013

(65) Prior Publication Data

US 2014/0353621 A1   Dec. 4, 2014

(30) Foreign Application Priority Data

May 29, 2013  (KR) .......................... 10-2013-0061257

(51) Int. Cl.
*H01L 51/40* (2006.01)
*H01L 51/00* (2006.01)
*H01L 51/56* (2006.01)
*H01L 27/32* (2006.01)

(52) U.S. Cl.
CPC ......... *H01L 51/0013* (2013.01); *H01L 27/3246* (2013.01); *H01L 51/56* (2013.01)

(58) Field of Classification Search
None
See application file for complete search history.

(56) References Cited

U.S. PATENT DOCUMENTS

| 2002/0030193 | A1* | 3/2002 | Yamazaki et al. ............... 257/98 |
| 2002/0193724 | A1* | 12/2002 | Stebbings ............... A61F 13/02 602/54 |
| 2009/0102008 | A1* | 4/2009 | Kakehata ............ H01L 21/2007 257/506 |
| 2011/0180203 | A1* | 7/2011 | Sun .................... B41M 5/38221 156/247 |
| 2012/0012848 | A1* | 1/2012 | Suh ................................. 257/59 |
| 2012/0025182 | A1* | 2/2012 | Umeda et al. .................... 257/40 |
| 2013/0005121 | A1* | 1/2013 | Ibe et al. ........................ 438/478 |
| 2013/0011943 | A1* | 1/2013 | Tsuruoka et al. ............... 438/22 |

FOREIGN PATENT DOCUMENTS

| JP | 2012-089522 | 5/2012 |
| KR | 1020090103012 A | 10/2009 |
| KR | 10-2011-0087830 | 8/2011 |

* cited by examiner

*Primary Examiner* — Mohammad Islam
*Assistant Examiner* — Jay C Chang
(74) *Attorney, Agent, or Firm* — Innovation Counsel LLP

(57) ABSTRACT

A method of manufacturing an organic light-emitting display apparatus, which can minimize damage to an emission layer, and an organic light-emitting display apparatus manufactured using the method are provided. The method includes: preparing a backplane including a pixel electrode and a pixel-defining layer protruding further than an upper surface of the pixel electrode and exposing at least a part of the pixel electrode; placing a donor film for laser-induced thermal imaging (LITI) on the backplane; irradiating a predetermined portion of the donor film with a first light from a laser beam to transfer a part of a transfer layer at the predetermined portion of the donor film to the backplane; irradiating at least one of the donor film and the backplane with a second light having a weaker output than that of the first light from the laser beam; and detaching the donor film from the backplane.

13 Claims, 7 Drawing Sheets

FIG. 7
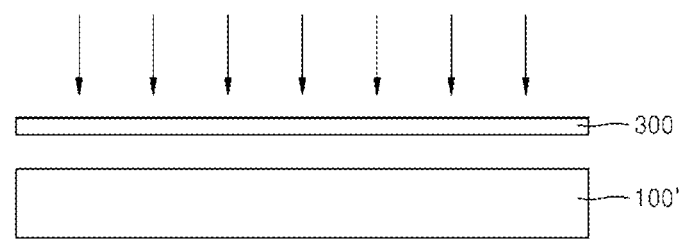
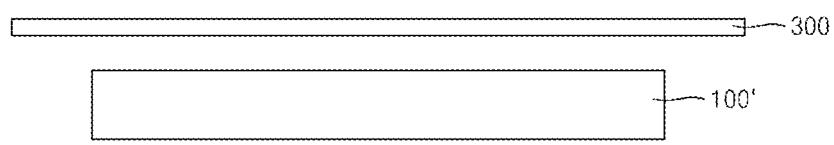
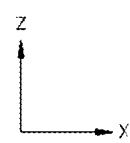

METHOD OF MANUFACTURING ORGANIC LIGHT-EMITTING DISPLAY APPARATUS INCLUDING A DONOR FILM AND TRANSFER LAYER

CROSS-REFERENCE TO RELATED PATENT APPLICATION

This application claims the benefit of Korean Patent Application No. 10-2013-0061257, filed on May 29, 2013, in the Korean Intellectual Property Office, the disclosure of which is incorporated herein in its entirety by reference.

BACKGROUND

1. Field of the Invention

The present invention relates to a method of manufacturing an organic light-emitting display apparatus and an organic light-emitting display apparatus manufactured by using the method, and more particularly, to a method of manufacturing an organic light-emitting display apparatus, which is capable of minimizing damage or defects during a process of forming an emission layer, and an organic light-emitting display apparatus manufactured by using the method.

2. Description of the Related Art

An organic light-emitting display apparatus is a type of display apparatus that includes an organic-light emitting diode in a display region. The organic light-emitting diode includes a pixel electrode and a counter electrode that face each other, with an intermediate layer, which includes an emission layer, disposed between the pixel and counter electrodes.

When the organic light-emitting display apparatus is manufactured, various methods may be used to form the emission layer, for example, a deposition method, an inkjet printing method, or laser-induced thermal imaging (LITI).

However, such conventional methods of manufacturing an organic light-emitting display apparatus have a problem in that the process of forming the emission layer is complex or the emission layer is damaged or defective during the process of forming the emission layer.

SUMMARY OF THE INVENTION

A method of manufacturing an organic light-emitting display apparatus, which is capable of minimizing damage or defects during a process of forming an emission layer, and an organic light-emitting display apparatus manufactured by using the method are provided.

According to an aspect, there is provided a method of manufacturing an organic light-emitting display apparatus, the method including: preparing a backplane including a pixel electrode and a pixel-defining layer protruding further than an upper surface of the pixel electrode and exposing at least a part of the upper surface of the pixel electrode; placing a donor film for laser-induced thermal imaging (LITI) on the backplane; irradiating a predetermined portion of the donor film with a first light from a laser beam to transfer a part of a transfer layer of the donor film at the predetermined portion to the backplane; irradiating at least one of the donor film and the backplane with a second light having a weaker output than that of the first light from the laser beam; and detaching the donor film from the backplane.

Irradiating at least one of the donor film and the backplane with a second light may include irradiating light having a wavelength band overlapping with a wavelength band of the first light from the laser beam.

Irradiating at least one of the donor film and the backplane with a second light may include irradiating light emitted from an infrared ray lamp and irradiating light having a wavelength in the range of 0.8 μm and 1.5 μm.

Irradiating at least one of the donor film and the backplane with a second light may include irradiating light toward a first surface of the donor film, the first surface of the donor film being opposite to a second surface of the donor film facing the backplane, irradiating light to the entire surface of a portion of the donor film corresponding to a display area of the backplane, and irradiating light to the entire surface of a portion of the donor film corresponding to the backplane.

Irradiating at least one of the donor film and the backplane with a second light may include irradiating light to at least one of the donor film and the backplane so that the donor film expands at a higher rate than the backplane.

Irradiating at least one of the donor film and the backplane with a second light may include irradiating light to at least one of the donor film and the backplane so that the donor film expands at a higher rate than a base substrate of the backplane.

According to another aspect, there is provided a method of manufacturing an organic light-emitting display apparatus, the method including: preparing a backplane including a pixel electrode and a pixel-defining layer protruding further than an upper surface of the pixel electrode and exposing at least a part of the upper surface of the pixel electrode; placing a donor film including a base layer that expands when heated, a light-to-heat conversion layer and a transfer layer on the backplane; irradiating a predetermined portion of the donor film with a first light from a laser beam to transfer a part of the transfer layer at the predetermined portion to the backplane; expanding the donor film at a higher rate than the backplane; and detaching the donor film from the backplane.

The expanding of the donor film at a higher rate than the backplane may include using a characteristic of the donor film that the thermal expansion coefficient of the donor film is higher than that of the backplane.

The expanding of the donor film at a higher rate than the backplane may include using a characteristic of the donor film that the thermal expansion coefficient of the donor film is higher than that of a base substrate of the backplane.

The expanding of the donor film at a higher rate than the backplane may include expanding the donor film at a higher rate than that of a base substrate of the backplane.

According to another aspect, there is provided an organic light-emitting display apparatus including: a base substrate; a plurality of pixel electrodes disposed on the base substrate; a pixel-defining layer protruding further than an upper surface of the pixel electrode and exposing at least a part of each of the plurality of pixel electrodes including a center portion of each of the plurality of pixel electrodes; and an intermediate layer patterned to correspond to each of the plurality of pixel electrodes, wherein the roughness of an edge portion of the intermediate layer in a center portion of the base substrate is higher than that of an edge portion of the intermediate layer at an edge of the base substrate.

The farther from the center portion of the base substrate and the closer to the edge thereof, the lower the roughness at the edge portion of the intermediate layer.

BRIEF DESCRIPTION OF THE DRAWINGS

The above and other features and advantages of the present invention will become more apparent by describing in detail exemplary embodiments thereof with reference to the attached drawings in which:

FIG. 7 is a schematic lateral view illustrating a change in the organic light-emitting display apparatus of FIGS. 5 and 6.

DETAILED DESCRIPTION OF THE INVENTION

Figure 1:
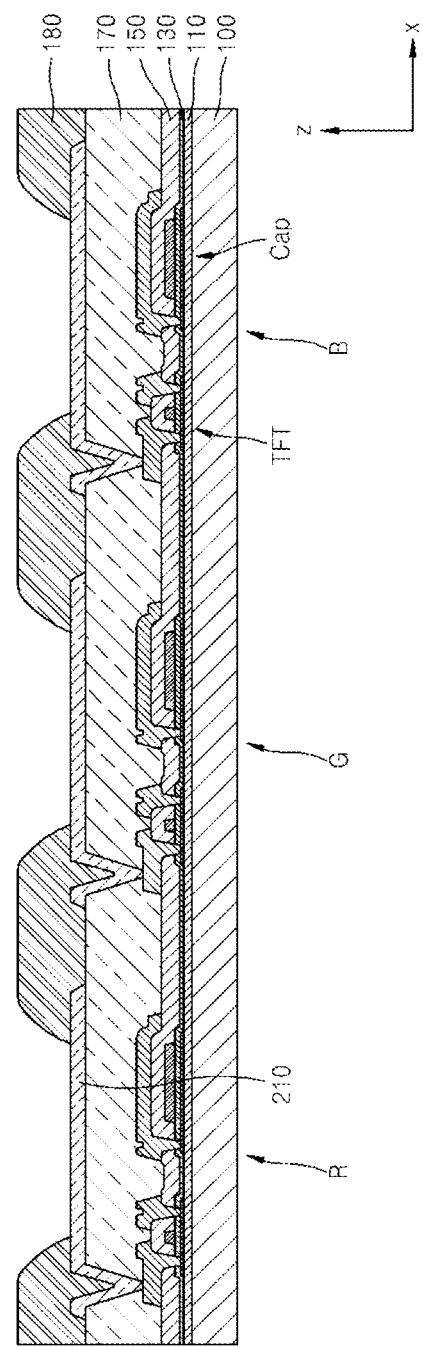
FIGS. 1 through 6 are schematic cross-sectional views illustrating a method of manufacturing an organic light-emitting display apparatus, according to an example embodiment.

Hereinafter, example embodiments will be described more fully with reference to the accompanying drawings, in which example embodiments are shown. The invention may, however, be embodied in many different forms and should not be construed as being limited to the example embodiments set forth herein. In the drawings, like reference numerals denote like elements, and the sizes and thicknesses of layers and regions are exaggerated for clarity.

Also, meanings of an x-axis, a y-axis, and a z-axis are not limited to three axes on an orthogonal coordinate system, but may be others. For example, the x-, y-, and z-axes may cross each other at right angles, but may alternatively denote other directions that do not cross each other at right angles.

It will also be understood that when a component, such as a layer, a film, a region, or a plate, is referred to as being "on" another component, it can be directly on the other component, or an intervening component may also be present.

As used herein, the term "and/or" includes any and all combinations of one or more of the associated listed items. Expressions such as "at least one of," when preceding a list of elements, modify the entire list of elements and do not modify the individual elements of the list.

FIGS. 1 through 6 are schematic cross-sectional views illustrating a method of manufacturing an organic light-emitting display apparatus, according to an example embodiment.

First, as shown in FIG. 1, a backplane 100' is prepared. In this regard, the backplane 100' may at least include a base substrate 100, a pixel electrode 210 formed on the base substrate 100, and a pixel-defining layer 180 exposing at least a part of the pixel electrode 210, the exposed part of pixel electrode 210 including a center portion of the pixel electrode 210. In this regard, the pixel-defining layer 180 may protrude (in a +z direction, perpendicular from the plane of the base substrate 100) above the pixel electrode 210 with respect to the base substrate 100.

The pixel electrode 210 may be a (semi-)transparent electrode or a reflective electrode. When the pixel electrode 210 is a (semi-)transparent electrode, the pixel electrode 210 may, for example, be formed of indium tin oxide (ITO), indium zinc oxide (IZO), zinc oxide (ZnO), indium oxide ($In_2O_3$), indium gallium oxide (IGO), or aluminum zinc oxide (AZO). When the pixel electrode 210 is a reflective electrode, the pixel electrode 210 may, for example, include a reflective film formed of silver (Ag), magnesium (Mg), aluminum (Al), platinum (Pt), palladium (Pd), gold (Au), nickel (Ni), neodymium (Nd), iridium (Ir), chromium (Cr), or a film formed of ITO, IZO, ZnO, or $In_2O_3$. However, the structure and materials of the pixel electrode 210 are not limited thereto and may vary.

The pixel-defining layer 180 may define pixels by having an opening that corresponds to each sub-pixel, i.e., an opening that exposes the center portion or the whole of the pixel electrode 210. Also, the pixel-defining layer 180 may prevent an arc from being generated at an edge of the pixel electrode 210 by increasing a distance between the edge of the pixel electrode 210 and an opposing electrode (not shown) disposed on the pixel electrode 210.

The backplane may further include other various components. For example, as shown in FIG. 1, a thin-film transistor TFT or a capacitor Cap may be formed on the base substrate 100. The backplane may further include other components, such as a buffer layer 110 for preventing impurities from penetrating into a semiconductor layer of the thin-film transistor TFT, a gate insulation film 130 for insulating a gate electrode from the semiconductor layer of the thin-film transistor TFT, an interlayer insulation film 150 for insulating source and drain electrodes of the thin-film transistor TFT from the gate electrode, and a planarization film 170 covering the thin-film transistor TFT and having an approximately flat top surface.

Figure 2:
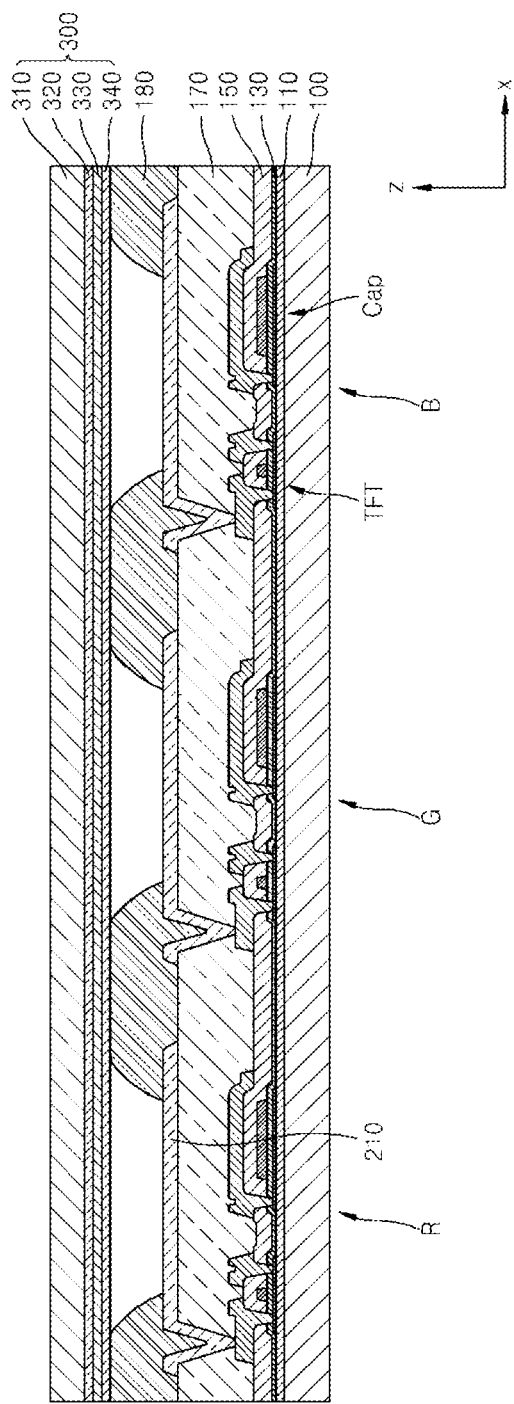

After the backplane is prepared, as shown in FIG. 2, a donor film 300 to be used for laser-induced thermal imaging is disposed on the backplane. Before the donor film 300 is disposed on the backplane, a layer (not shown), such as a hole injection layer or a hole transport layer, may be previously formed on the pixel electrode 210 or on the entire surface of the base substrate 100.

The donor film 300 may include a base film 310, a light-to-heat conversion layer 320, an intermediate layer 330, and a transfer layer 340.

The base film 310 may, for example, be formed of polyester, such as polyethylene terephthalate (PET), polyacryl, polyepoxy, polyethylene, and/or polystyrene, in order to transfer light to the light-to-heat conversion layer 320. The base film 310 may be formed of a material that expands when heated.

The light-to-heat conversion layer 320 is a layer for converting at least a part of the energy of a laser beam to heat by absorbing the laser beam light. The light-to-heat conversion layer 320 may, for example, be a metal film formed of a metal, such as aluminum or silver, capable of absorbing light in the infrared to visible light range, an oxide/sulfide film of such a metal, or an organic polymer film including carbon black or graphite.

The transfer layer 340 is a layer to be transferred to the backplane 100' on a contacting surface by heat generated by the light-to-heat conversion layer 320. The transfer layer 340 may be a layer including, for example, an emission material for the light-emitting display apparatus. The transfer layer 340 may, for example, be a layer including a hole injection material, a hole transport material, an electron transport material, or an electron injection material. The transfer layer 340 may, for example, have a multilayer structure according to circumstances.

The intermediate layer 330 may be disposed between the light-to-heat conversion layer 320 and the transfer layer 340. The intermediate layer 330 may, for example, be a gas-generating layer formed of pentaerythritol tetranitrate (PETN) or trinitrotoluene (TNT) for generating nitrogen gas or hydrogen gas by absorbing light or heat transferred from the light-to-heat conversion layer 320 to generate a decomposition reaction, or may, for example, be a prevention layer for preventing a part of the light-to-heat conversion layer 320 from being smeared on and contaminating the transfer layer 340 when the transfer layer 340 is transferred. When the intermediate layer 330 is a gas-generating layer, the intermediate layer 330 may generate a gas to satisfactorily separate the transfer layer 340 from the intermediate layer 330 or the light-to-heat conversion layer 320 when the transfer layer 340 is transferred.

Figure 3:
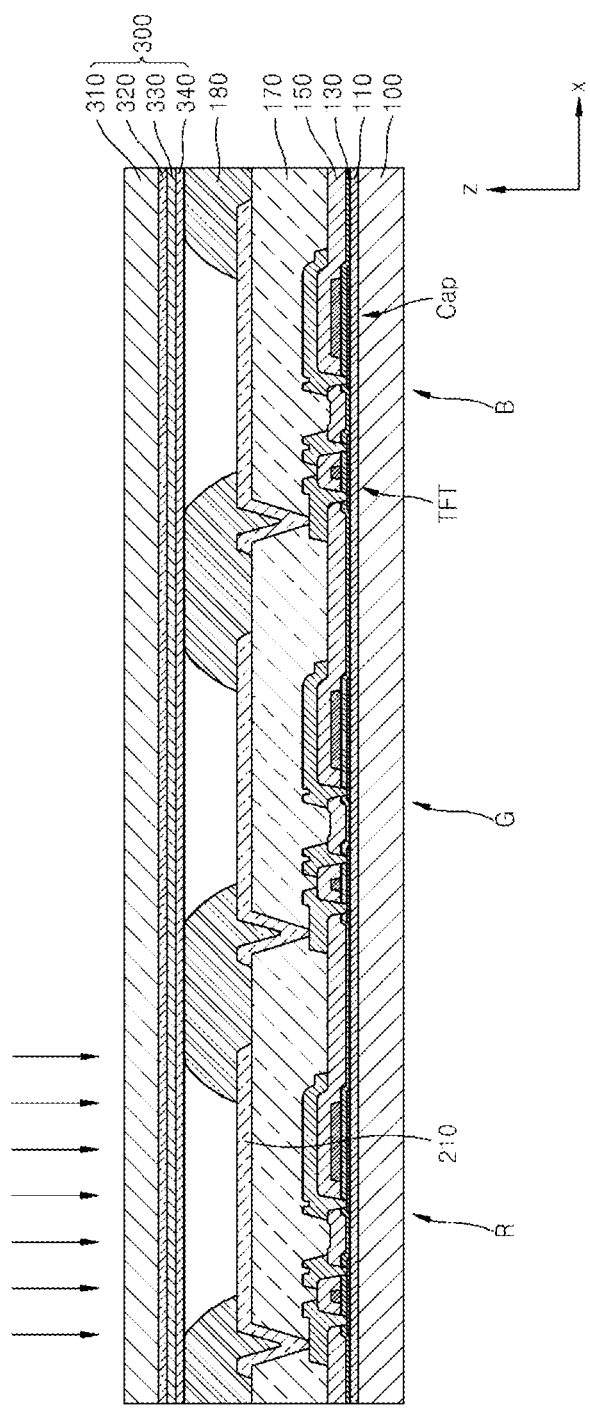

Thereafter, as shown in FIG. 3, a laser beam (indicated by the arrows) is irradiated on a predetermined portion of the donor film 300 so that a part of the transfer layer 340 of the donor film 300 is transferred to the backplane.

Figure 4:
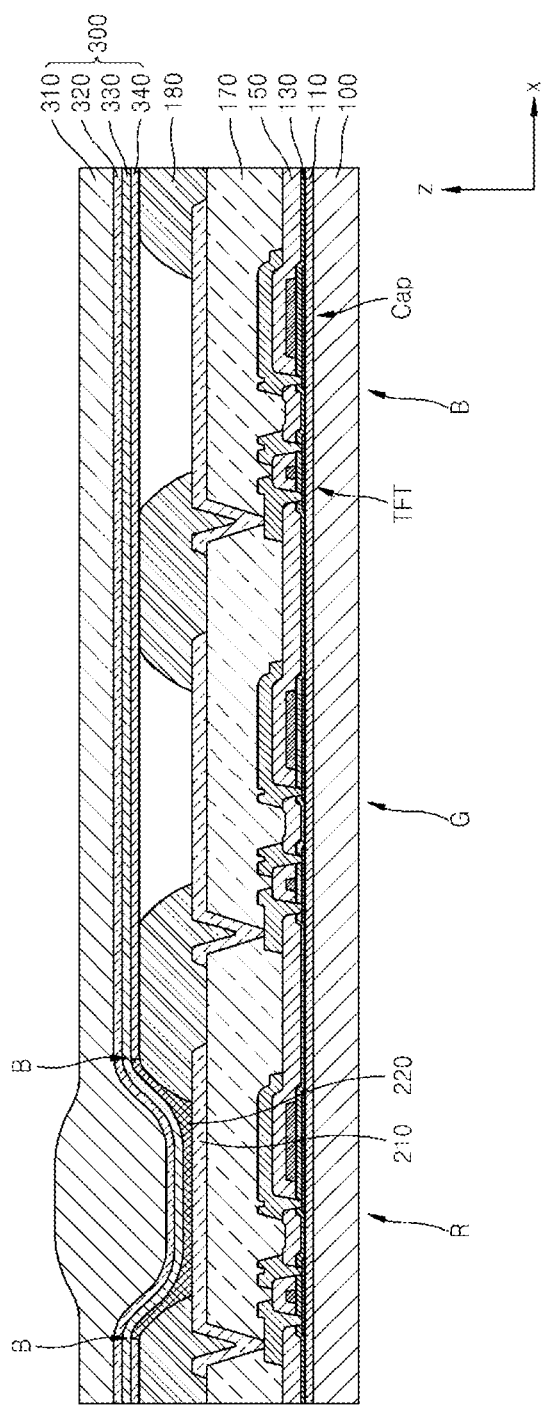

For example, when the transfer layer 340 of the donor film 300 is a layer including a material emitting a red light, the portion of the donor film 300 that is irradiated with the laser beam corresponds to a red sub-pixel R, for example among the red sub-pixels R, a green sub-pixels G, and a blue sub-pixels B of the backplane. In this case, heat is generated in a region of the light-to-heat conversion layer 320 irradiated with the laser beam, and, as shown in FIG. 4, the base film 310 in the region irradiated by the laser beam is swollen by the heat, and thus the transfer layer 340 of the donor film 300 becomes a transfer layer 220 on the backplane 100'. As shown in FIG. 4, the transfer layer 220 is disposed in the region irradiated by the laser beam and contacts a surface of the pixel electrode 210 and the pixel-defining layer 180 of the red sub-pixel R of the backplane. Alternatively, and different from what is shown in FIG. 4, the light-to-heat conversion layer 320 or the intermediate layer 330 may also become swollen by the heat, in addition to, or instead of, the base film 310.

Because the transfer layer 340 in the region where the laser beam is irradiated contacts the surface of the pixel electrode 210 or the pixel-defining layer 180 of the red sub-pixel R of the backplane, and is affected by the heat generated by the light-to-heat conversion layer 320, the transfer layer 340 is transferred to the surface of the pixel electrode 210 or the pixel-defining layer 180 to become transfer layer 220 of the backplane 100'. However, because the transfer layer 340 in a region that is not irradiated by the laser beam is not affected by the heat generated by the light-to-heat conversion layer 320, even if the transfer layer 340 partially contacts a top surface of the pixel-defining layer 180, the transfer layer 340 in the region that is not irradiated by the laser beam may not be transferred to the backplane 100'. However, the transfer layer 340 may be partially smeared on the top surface of the pixel-defining layer 180.

Figure 5:
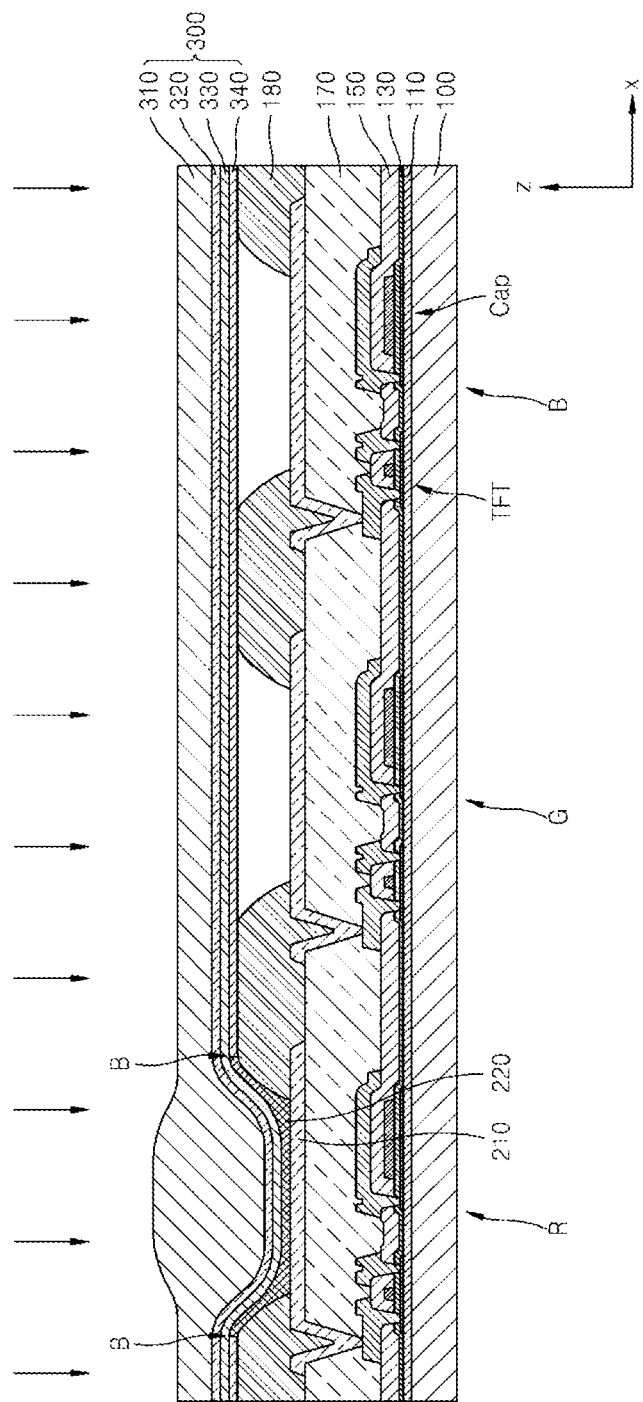

Thereafter, as shown in FIG. 5, at least one of the donor film 300 and the backplane is irradiated with light having a weaker output than that of the laser beam used during the transfer process (as indicated by the arrows in FIG. 5). In more detail, light having a wavelength band overlapping with a wavelength band of a laser beam used during a process of transferring a part of the transfer layer 340 of the donor film 300 to the backplane may be used. For example, light emitted from an infrared ray lamp may be used. Such a light may be light having a wavelength in the range of 0.8 μm and 1.5 μm.

Figure 6:
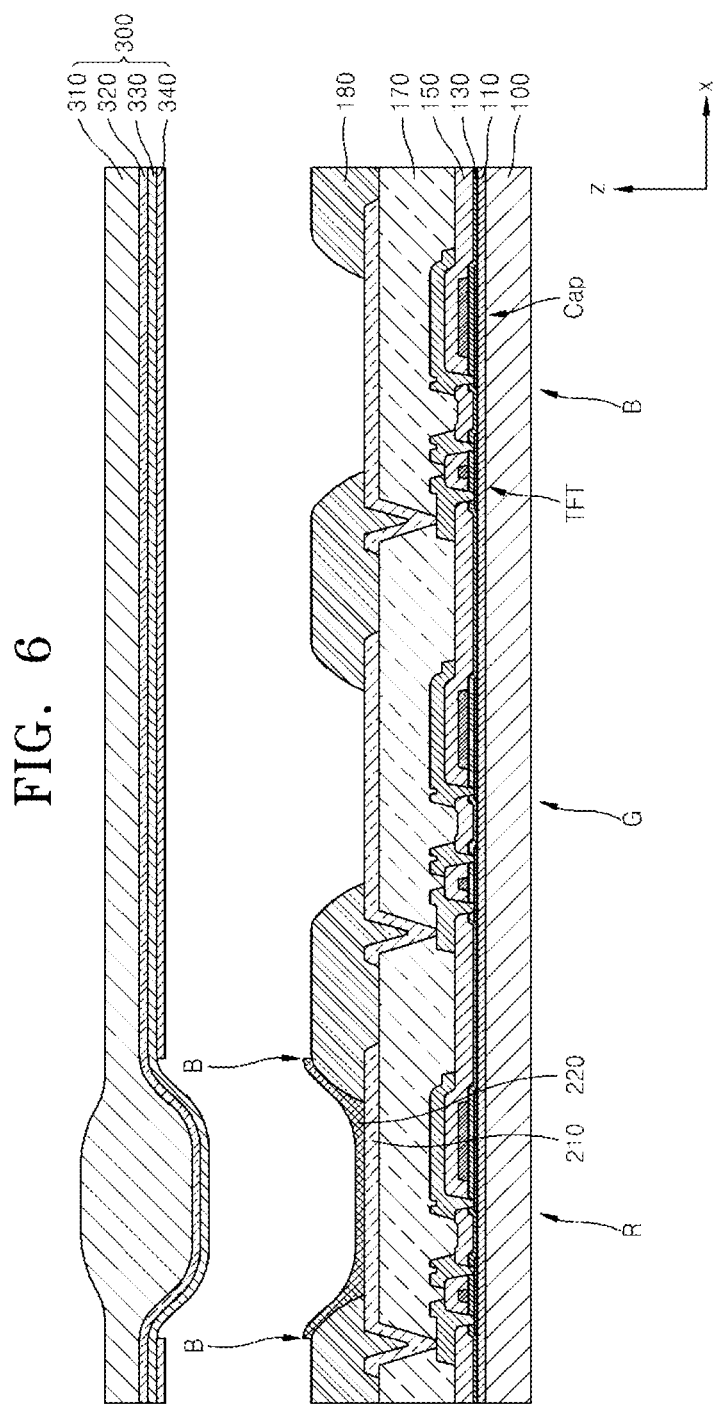

When irradiated with such a light, an expansion rate of the donor film 300 and an expansion rate of the backplane may be different due to different thermal expansions of the donor film 300 and the backplane. Thus, a (small) crack occurs in a boundary BD between the transfer layer 340 in the region of the donor film 300 that was not irradiated with the laser beam, and the transfer layer 220 that was irradiated and transferred to the backplane. As shown in FIG. 6, when the donor film 300 is detached from the backplane, the transfer layer 340 in the region of the donor film that was not irradiated with the laser beam, and the transfer layer 220 transferred to the backplane may be clearly separated from each other.

If at least one of the donor film 300 and the backplane is not irradiated with light having a weaker output than that of the laser beam used during the transfer process, the transfer layer 340 in the region of the donor film 300 not irradiated with the laser beam and the transfer layer 220 transferred to the backplane may be not separated from each other. Thus, when the donor film 300 is detached from the backplane, a defect may occur, for instance a part of the transfer layer 220 transferred to the backplane may be torn out by adhering to the transfer layer 340 in the region where the laser beam of the donor film 300 is not irradiated.

However, according to the method of manufacturing an organic light-emitting display apparatus of the present example embodiment, at least one of the donor film 300 and the backplane is irradiated with light having a weaker output than that of the laser beam used during the transfer process. Thus, when the donor film 300 is detached from the backplane, the potential defect in which a part of the transfer layer 220 transferred to the backplane may be torn out as the result of adherence to the transfer layer 340 in the region of the donor film 300 not irradiated with the laser beam may be effectively prevented.

The light having the weaker output than that of the laser beam used during the transfer process may be used to irradiate at least one of the donor film 300 and the backplane so as to expand the donor film 300 at a higher rate than that of the base substrate 100 of the backplane. When a glass substrate is used as the base substrate 100, because the thermal expansion of the donor film 300 is higher than that of the glass substrate, the donor film 300 may be effectively detached from the backplane. In more detail, the base film 310 of the donor film 300 may expand at a higher rate than that of the base substrate 100 of the backplane.

Because light used to irradiate at least one of the donor film and the backplane has a weaker output than that of the laser beam used during the transfer process, so as to expand the donor film 300 more than the backplane, the light may be directly irradiated to the donor film 300 other than the backplane for an effective thermal expansion of the donor film 300. That is, as shown in FIG. 5, the light may be irradiated (in a −z direction) toward a first surface of the donor film 300. In this regard, the first surface of the donor film 300 is opposite to a second surface of the donor film 300 that faces the backplane.

When at least one of the donor film 300 and the backplane 100' is irradiated with the light having the weaker output than that of the laser beam used during the transfer process, the entire surface of a portion of the donor film 300 corresponding to the backplane and the entire surface of the donor film 300 corresponding to a display area of the backplane may be irradiated with the light having the weaker output.

As described above, after the donor film 300 is detached from the backplane, depending upon the display apparatus being manufactured, an electron transport layer or an electron injection layer may be formed to correspond to each of the plurality of pixel electrodes 210, or to correspond to the entire surface of the base substrate 100, by using, for example, CVD or laser-induced thermal imaging (LITI). Further, opposing electrodes corresponding to the plurality of pixel electrodes 210 are formed on the entire surface of the base substrate 100, thereby manufacturing the organic light-emitting display apparatus.

Although it is described above that a (small) crack occurs in the boundary BD between the transfer layer 340 in the region of the donor film not irradiated by the laser beam and the transfer layer 220 transferred to the backplane, which (small) cracks occur by irradiating light having a weaker output than that of the laser beam used during the transfer process to at least one of the donor film 300 and the backplane, the present disclosure is not limited thereto.

That is, the organic light emitting display may be manufactured if the donor film 300 is detached from the backplane by irradiating a laser beam onto the predetermined portion of the donor film 300, as shown in FIG. 3, irradiating a laser beam onto a part of the transfer layer 340 of the donor film 300 to the backplane as shown in FIG. 4, allowing the donor film 300 to expand at a higher rate than the backplane through any methods, and causing a (small) crack to occur in the boundary BD between the transfer layer 340 in the region where the laser beam of the donor film 300 is not irradiated and the transfer layer 220 transferred to the backplane.

To cause a (small) crack to occur in the boundary BD between the transfer layer 340 in the region of the donor film 300 not irradiated with the laser beam and the transfer layer 220 transferred to the backplane by expanding the donor film 300 at a higher rate than the backplane, a characteristic of the donor film 300 that the thermal expansion coefficient thereof is higher than that of the backplane may be used. The operation of allowing the donor film 300 to expand at a higher rate than the backplane may be an operation of using a characteristic of the donor film 300 that the thermal expansion coefficient thereof is higher than that of the base substrate 100, such as a glass substrate, of the backplane.

As described above, a (small) crack occurs in the boundary B between the transfer layer 340 in the region of the donor film not irradiated with the laser beam and the transfer layer 220 transferred to the backplane by expanding the donor film 300 at a higher rate than the base substrate 100 of the backplane. Thus, when the donor film 300 is detached from the backplane, the potential defect that a part of the transfer layer 220 transferred to the backplane may be torn out by adhering to the transfer layer 340 in the region of the donor film 300 not irradiated with the laser beam may be effectively prevented.

Although the method of manufacturing an organic light-emitting display apparatus is described above, the present disclosure is not limited thereto. An organic light-emitting display apparatus manufactured by using the same method also belongs to the scope of the present disclosure.

The organic light-emitting display apparatus according to an example embodiment includes the base substrate 100, the plurality of pixel electrodes 210 disposed on the base substrate 100, the pixel-defining layer 180 exposing at least a part of each of the pixel electrodes 210 including a center portion thereof and protruding further than the pixel electrodes 210 with respect to the base substrate 100, and a transfer layer patterned to correspond to each of the pixel electrodes 210. In addition, as necessary, the organic light-emitting display apparatus may further include the thin film transistor TFT, the capacitor Cap, etc.

In the organic light-emitting display apparatus according to the present example embodiment, the roughness of an edge portion of the transfer layer 220 in a center portion of the base substrate 100 may be higher than that of an edge portion of the intermediate layer at an edge of the base substrate 100.

As described above, during a process of manufacturing the organic light-emitting display apparatus, a (small) crack occurs in the boundary B between the transfer layer 340 in the region of the donor film 330 not irradiated with the laser beam and the transfer layer 220 transferred to the backplane by expanding the donor film 300 at a higher rate than the base substrate 100 of the backplane. Thus, when the donor film 300 is detached from the backplane, the potential defect that a part of the transfer layer 220 transferred to the backplane may be torn out by adhering to the transfer layer 340 in the region of the donor film 300 not irradiated with the laser beam may be effectively prevented.

In this regard, FIG. 7 is a schematic lateral view illustrating a change in the organic light-emitting display apparatus of FIGS. 5 and 6. As can be seen in FIG. 7, the donor film 300 expands relatively more (within an x-y plane) than a backplane 100'. During this process, a change in a position of a point on the donor film 300 in the center portion of the backplane 100' due to the expansion of the donor film 300 is less than a change in the position of the point on the donor film 300 at the edge of the backplane 100' due to the expansion of the donor film 300. Thus, when the crack occurs in the boundary BD between the transfer layer 340 in the region of the donor film 300 not irradiated with the laser beam and the transfer layer 220 transferred to the backplane, a bigger crack may occur in a portion corresponding to the edge of the backplane 100', and a smaller crack may occur in a portion corresponding to the center portion of the backplane 100'.

The occurrence of a smaller crack means that the boundary BD between the transfer layer 340 in the region of the donor film 300 not irradiated with the laser beam and the transfer layer 220 transferred to the backplane may not be completely separated. Thus, in this case, when the donor film 300 is detached from the backplane 100', because the transfer layer 220 is likely to be torn out at the boundary BD, an edge portion of the transfer layer 220 transferred to the backplane may have a greater roughness.

The occurrence of a big crack at the boundary BD indicates that there may be a complete separation at the boundary B between the transfer layer 340 in the region of the donor film 300 not irradiated with the laser beam and the transfer layer 220 transferred to the backplane. Thus, in this case, when the donor film 300 is detached from the backplane 100', because the transfer layer 220 is unlikely to be torn out in the boundary BD between the transfer layer 340 in the region of the donor film 300 not irradiated with the laser beam and the transfer layer 220 transferred to the backplane, an edge portion of the transfer layer 220 transferred to the backplane may have a lower roughness, i.e., is smoother.

Therefore, in the organic light-emitting display apparatus manufactured by using the method described above, the roughness of the dgeportion at boundary BD of the transfer layer 220 in the center portion CP of the base substrate 100 may be higher than that of the edge portion at boundary BD of the transfer layer 220 in the edge portion EP of the base substrate 100'. In particular, as shown in FIG. 7, when the donor film 300 expands relatively more than the backplane 100', the farther from the center portion of the backplane 100' and the closer to the edge thereof, the greater the change in the position of the point on the donor film 300 due to the expansion of the donor film 300. Therefore, when a crack occurs in the boundary BD between the transfer layer 340 in the region of the donor film 300 not irradiated with the laser beam and the transfer layer 220 transferred to the backplane, because the farther from the center portion of the backplane 100' and the closer to the outer edge thereof, the bigger the crack that occurs in the boundary BD, in the manufactured organic light-emitting display apparatus, the farther from the center portion of the base substrate 100 and the closer the outer edge thereof, the lower the roughness at the edge portion of the boundary BD of the transfer layer 220.

As described above, according to one or more embodiments of the present disclosure, a method of manufacturing an organic light-emitting display apparatus, which is capable of minimizing damage or defects during a process of forming an emission layer, and an organic light-emitting display apparatus manufactured by using the method may be implemented. However, the scope of the present disclosure is not limited by such effects.

While the present disclosure has been particularly shown and described with reference to example embodiments thereof, it will be understood by those of ordinary skill in the art that various changes in form and details may be made therein without departing from the spirit and scope of the present disclosure, including the following claims.

What is claimed is:

1. A method of manufacturing an organic light-emitting display apparatus, the method comprising:
   preparing a backplane including a pixel electrode and a pixel-defining layer protruding further than an upper surface of the pixel electrode and exposing at least a part of the upper surface of the pixel electrode;
   placing a donor film for laser-induced thermal imaging (LITI) on the backplane;
   irradiating a predetermined portion of the donor film with a first light from a laser beam to transfer a part of a transfer layer of the donor film at the predetermined portion to the backplane;
   after transferring the part of the transfer layer of the donor film to the backplane, irradiating at least one of the donor film and the backplane with a second light having a weaker output than that of the first light from the laser beam; and
   detaching the donor film from the backplane.

2. The method of claim 1, wherein the irradiating at least one of the donor film and the backplane with a second light comprises irradiating light having a wavelength band overlapping with a wavelength band of the first light from the laser beam.

3. The method of claim 1, wherein the irradiating at least one of the donor film and the backplane with a second light comprises irradiating light emitted from an infrared ray lamp.

4. The method of claim 3, wherein the irradiating at least one of the donor film and the backplane with a second light comprises irradiating light having a wavelength in the range of 0.8 μm and 1.5 μm.

5. The method of claim 1, wherein the irradiating at least one of the donor film and the backplane with a second light comprises irradiating light toward a first surface of the donor film, the first surface of the donor film being opposite to a second surface of the donor film facing the backplane.

6. The method of claim 5, wherein the irradiating at least one of the donor film and the backplane with a second light comprises irradiating light to the entire surface of a portion of the donor film corresponding to a display area of the backplane.

7. The method of claim 5, wherein the irradiating at least one of the donor film and the backplane with a second light comprises irradiating light to the entire surface of a portion of the donor film corresponding to the backplane.

8. The method of claim 1, wherein the irradiating at least one of the donor film and the backplane with a second light comprises irradiating light to at least one of the donor film and the backplane so that the donor film expands at a higher rate than the backplane.

9. The method of claim 1, wherein the irradiating at least one of the donor film and the backplane with a second light comprises irradiating light to at least one of the donor film and the backplane so that the donor film expands at a higher rate than a base substrate of the backplane.

10. A method of manufacturing an organic light-emitting display apparatus, the method comprising:
    preparing a backplane including a pixel electrode and a pixel-defining layer protruding further than an upper surface of the pixel electrode and exposing at least a part of the upper surface of the pixel electrode;
    placing a donor film including a base layer, a light-to-heat conversion layer and a transfer layer on the backplane;
    irradiating a predetermined portion of the donor film with a first light from a laser beam to transfer a part of the transfer layer at the predetermined portion to the backplane;
    after transferring the part of the transfer layer at the predetermined portion to the backplane, expanding both of the donor film and the backplane while expanding the donor film at a higher rate than the backplane; and
    detaching the donor film from the backplane by a difference of thermal expansion between the donor film and the backplane.

11. The method of claim 10, wherein the expanding of the donor film at a higher rate than the backplane comprises using a characteristic of the donor film that a thermal expansion coefficient of the donor film is higher than that of the backplane.

12. The method of claim 10, wherein the expanding of the donor film at a higher rate than the backplane comprises using a characteristic of the donor film that a thermal expansion coefficient of the donor film is higher than that of a base substrate of the backplane.

13. The method of claim 10, wherein the expanding of the donor film at a higher rate than the backplane comprises expanding the donor film at a higher rate than that of a base substrate of the backplane.

* * * * *